United States Patent [19]

Hughes et al.

[11] 4,152,641

[45] May 1, 1979

[54] METHOD AND APPARATUS FOR THE DETERMINATION OF SIGNAL PICKUP QUALITIES OF A STYLUS OF A CAPACITIVE DISC VIDEO PLAYER

[75] Inventors: Gary W. Hughes; Hirohisa Kawamoto, both of Princeton, N.J.

[73] Assignee: RCA Corporation, New York, N.Y.

[21] Appl. No.: 881,256

[22] Filed: Feb. 27, 1978

[51] Int. Cl.$^2$ ............................................. G01R 27/26
[52] U.S. Cl. ............................ 324/61 R; 179/100.1 B
[58] Field of Search ............... 324/61 R; 179/100.1 B; 358/128; 274/38; 361/313

[56] References Cited

U.S. PATENT DOCUMENTS

| | | | |
|---|---|---|---|
| 3,842,194 | 10/1974 | Clemens | 358/128 |
| 3,842,217 | 10/1974 | Clemens | 179/100.1 B X |
| 3,873,782 | 3/1975 | Palmer | 179/100.1 B |
| 3,909,517 | 9/1975 | Clemens | 179/100.1 B X |

Primary Examiner—Stanley T. Krawczewicz
Attorney, Agent, or Firm—E. M. Whitacre; J. S. Tripoli

[57] ABSTRACT

Stylus suitable for use in a capacitive disc record playback apparatus comprises a wedge-shaped support material and an electrode formed on a flat longitudinal surface of the support material. Signal pickup qualities of such stylus can be determined by supporting such stylus on a silicon dioxide-silicon wafer where the capacitance formed between the electrode bottom and the wafer can be changed at a cyclical rate by energizing the wafer with a low frequency signal. A tuned resonator circuit coupled to the electrode detects those capacitance variations and additional undesired capacitance variations contributed by fringe capacitance between the whole of the electrode and the wafer. Where the wafer is of an n-type silicon material, the contribution of the fringe capacitance to the detected capacitance variations is reduced by growing a large quantity of positive charge in the silicon dioxide layer of the wafer.

9 Claims, 6 Drawing Figures

1

METHOD AND APPARATUS FOR THE DETERMINATION OF SIGNAL PICKUP QUALITIES OF A STYLUS OF A CAPACITIVE DISC VIDEO PLAYER

The present invention relates, in general, to electrical detection systems and more particularly to methods and apparatus for the determination of the playing qualities of a signal pickup for a capacitive video disc player.

In U.S. Pat. No. 3,842,194—Clemens, video disc playback systems of a variable capacitance form are disclosed. In an arrangement therein described, an information track incorporates geometric variations in the bottom of a spiral groove in a disc, the surface of which disc comprises conductive material covered with a thin coating of dielectric material. Variations in the capacitance presented between a conductive electrode on a tracking stylus supported in this groove and the conductive material of the disc occur as the disc is rotated. The capacitance variations are sensed to recover the recorded information.

In one particularly successful format employed for the groove bottom information track in practice of the Clemens invention, depressed areas extending across the groove bottom alternate with non-depressed areas, with the frequency of alternation varying with the amplitude of video signals which were recorded in the information track. The form of the recorded signal is thus a carrier frequency modulated in accordance with video signals. In playback of a video disc embodying the aforementioned Clemens principles, variations in spacing between the stylus electrode bottom and the groove bottom regions passing beneath the stylus provided by the alternating depressed and non-depressed regions of the groove bottom are used to vary the resonant frequency of a tuned circuit excited by an RF oscillator. A suitable detector circuit converts the resonant frequency changes to an amplitude varying output signal, which may then be processed in a manner appropriate to the modulation pattern employed on the disc to derive, for example, video output signals for application to a video input monitor.

The quality of the signals recovered upon playback of a disc of the above-described type will depend to a large extent on the capacitance variations between the electrode bottom and the conductive material of the disc. During the electrode manufacturing process, styli may be produced with defects such as incompletely formed electrodes and chipped or cracked electrode bottoms. Such defective styli effects, upon playback of a record, recovery of signal information which is highly degraded, leading to the reproduction of pictures of unacceptable quality to the viewer.

Pursuant to the principles of the present invention, method and apparatus are provided for the determination of the playback qualities of production styli with a high degree of accuracy and which method and apparatus obviate the need for actual playback of a video disc record and thereby greatly simplify the detection of defective styli.

In accordance with an illustrative embodiment of the present invention, a dielectric stylus support, having a longitudinal dimension, has a rear surface coated (e.g., by use of a suitable sputtering technique) with a conductive layer of hafnium of a thickness of approximately 1/10 of a micron to form an electrode. Signal pickup qualities of such stylus is determined by contacting the tip of such stylus on a silicon dioxide-silicon wafer where the capacitance formed between the electrode bottom and the wafer is changed at a cylical rate by energizing the wafer with a low frequency signal. A tuned resonator circuit coupled to the electrode detects those capacitance variations providing a relatively large amplitude output when the stylus is substantially defect-free.

The detected capacitance variations include an undesired contribution by the fringe capacitance between the whole of the electrode and the wafer. In accordance with one aspect of the present invention, a large quantity of positive charge is grown in the silicon dioxide layer of the wafer (assuming that an n-type silicon wafer is employed) to practically effect a shift of a first biasing voltage value about which fringe capacitance variations occur away from a second biasing voltage value about which electrode bottom capacitance variations occur. The wafer is then cyclically energized about the second threshold voltage within limits which exclude the first threshold voltage to thereby reduce fringe capacitance contributions to the detected capacitance variations. The reduction of the aforementioned fringe capacitance contributions enhances the accuracy of the stylus quality determination process of the present invention.

In accordance with yet another aspect of the present invention, determination of playback qualities of production styli by a static testing process (as opposed to a dynamic testing process where relative motion between the stylus and a dielectrically coated conductive surface need be established) enables rapid and efficient testing of production styli. With possible damage to production styli from a dynamic testing process (e.g., during stylus set down on a moving surface) eliminated, the yield of manufactured styli with good playback qualities is increased.

Figure 1:
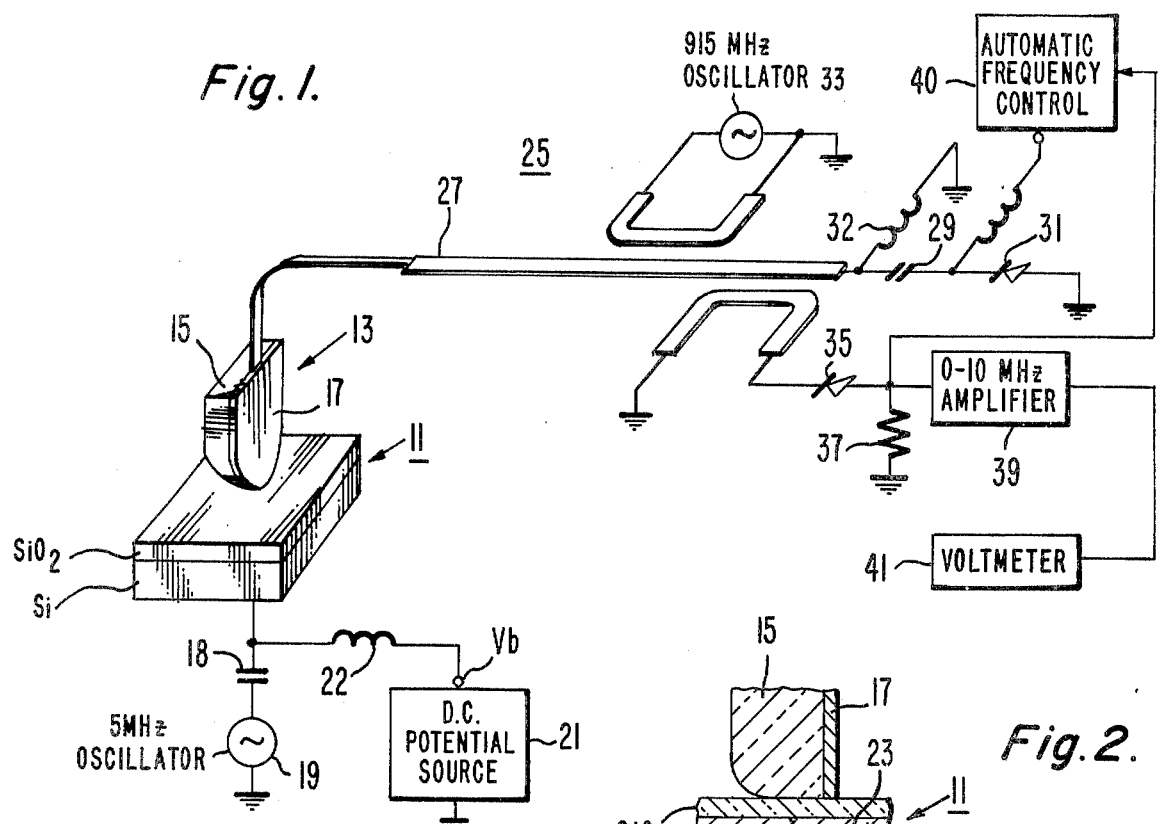
FIG. 1 illustrates partially via block diagram representations, stylus testing apparatus embodying the principles of the present invention.
Figure 3A:
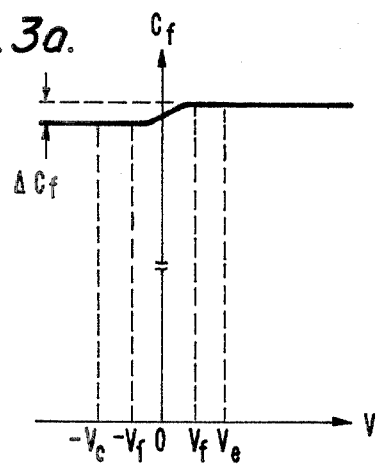
Figure 4A:
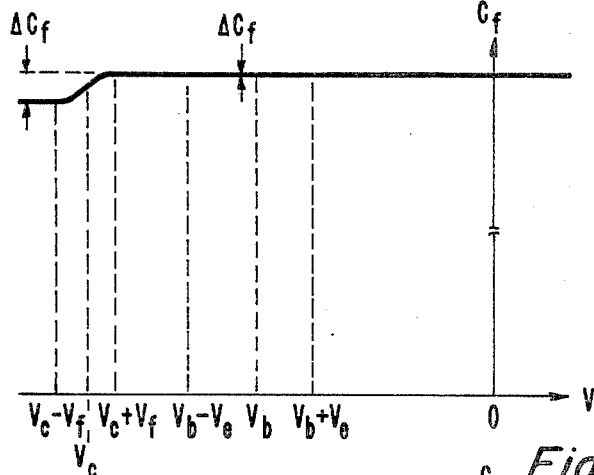
Figure 3B:
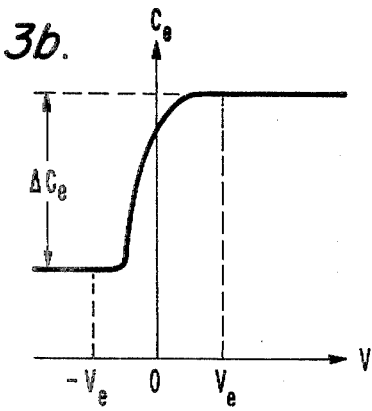
Figure 4B:
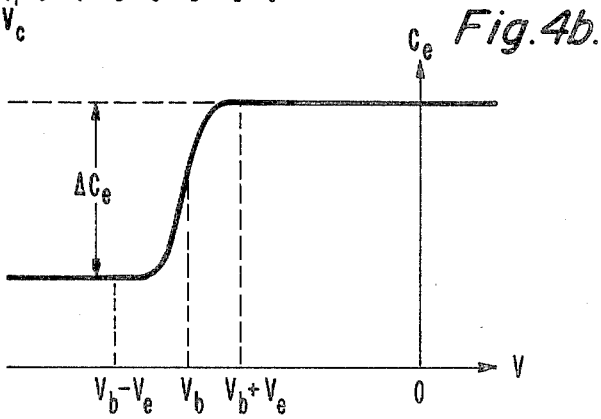

FIGS. 3a and 3b graphically illustrate respective capacitances formed, in the apparatus of FIG. 1, between the wafer and the whole of the electrode and the bottom of the electrode respectively, in the absence of a positive charge grown on the oxide layer of the wafer; and FIGS. 4a and 4b graphically illustrate respective capacitances formed, in the apparatus of FIG. 1, between the wafer and the whole of the electrode and the bottom of the electrode respectively in the presence of a positive charge grown on the oxide layer of the wafer.

In FIG. 1, an n-type silicon-silicon dioxide wafer 11 supports a stylus 13, of the type disclosed in the aforementioned Clemens patent. Stylus 13 comprises a wedge-shaped dielectric support element 15 and a hafnium conductive element disposed on a rear longitudinal surface of the support element to form an electrode 17. Since in playback of a capacitive video disc, of the aforementioned Clemens type, signal recovery is accomplished via detection of the capacitive variations between the electrode bottom and a conductive surface of the disc, the bottom of electrode 17 desirably extends to the tip of the wedge shaped support element 15 to enhance such capacitive detection. The silicon layer of the wafer 11 is energized, through a blocking capacitor 18, by the output of a first oscillator 19 (operating at an illustrative output frequency of 5 MHz). The output of oscillator 19 is shifted about a dc level by means of a source 21 of dc potential which is coupled to the output of the blocking capacitor via choke 22.

Figure 2:
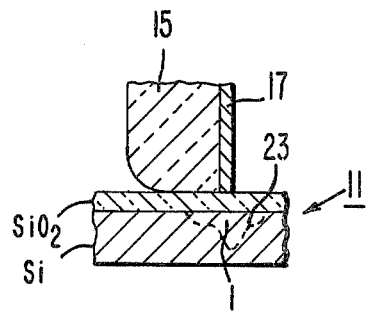
FIG. 2 illustrates a cross-section of the MOS structure formed by the stylus electrode and the supporting semi-conductor wafer illustrated in FIG. 1.

Stylus 13 and the supporting wafer 11 effectively form a metal-oxide-semiconductor (MOS) capacitor structure. A voltage differential between electrode 17 and ohmic back-contact of the silicon wafer causes depletion of a primary silicon region beneath the electrode bottom which will effectively change the capacitance of the MOS capacitor structure. This voltage differential also effects depletion of additional silicon regions which outwardly fringe the primary depleted region, with the degree of depletion effected in those additional fringing regions diminishing in relation to distance from the primary depleted region. FIG. 2 graphically illustrates a depletion region, having a boundary 23, which is formed in the silicon layer upon application of a proper biasing potential. As illustrated, the boundary 23 of the depletion region includes a trough 1 indicative of the primary depletion region, located in the silicon layer region directly beneath the electrode 17. The boundary 23 tapers off with increasing distance away from electrode 17.

It will be appreciated that change in the capacitance of the MOS structure created by the depletion regions as illustrated in FIG. 2 will be effected by two components. The first component is the capacitive coupling between the bottom of the electrode and the primary depletion region (edge capacitance) while the second component is the capacitive coupling between the whole of electrode 17 and the fringing depletion regions (fringe capacitance).

The relationship between biasing voltage and the respective normalized fringe capacitance $C_f$ and edge capacitance $C_e$ is illustrated respectively in FIGS. 3a and 3b. As shown in FIGS. 3a and 3b, each of the capacitance curves can be characterized as being variable only within respective narrow ranges of values of the biasing voltages. The limits of the respective ranges being determined by several factors such as the thickness of the semiconductor layer, semiconductor doping, the grown oxide charge, the thickness of oxide layer and the distance between the electrode and the surface of the oxide layer. In the absence of an oxide charge, the respective ranges of biasing voltages ($-V_f$ to $V_f$ and $-V_e$ to $V_e$) effecting capacitance variations overlap to a degree which renders the ability to distinguish edge capacitance variations from fringe capacitance variations difficult. Since the variation in fringe capacitance $C_f$ could be of comparable magnitude to the variation in edge capacitance $C_e$ due to the much larger surface area of the electrode as a whole (FIGS. 3a and 3b respectively show normalized curves only), the ability to distinguish between a defective and a non-defective stylus is somewhat compromised, it being recalled that good playing qualities of a stylus are largely dependent on edge capacitance variations.

To enhance the ability of the apparatus of the present invention to distinguish between defective and non-defective styli, in accordance with one embodiment of the present invention, growth of a large quantity of positive charge is effected during the wafer manufacturing process (in a manner which is well known in the semiconductor manufacturing arts). These positive charges effect a practical separation in the respective ranges of biasing voltages effecting both fringe and edge capacitance variations as illustrated in FIGS. 4a and 4b, respectively. Edge capacitance variations can now be caused by appropriate biasing voltage variations within a range of values ($V_b - V_e$ to $V_b + V_e$) which do not cause corresponding variations of fringe capacitance.

With reference again to FIG. 1, it will now be appreciated that with positive charges grown on the oxide layer, the output of DC source 21 provides a bias of $V_b$ within a range of values defined between the limits $V_b - V_e$ and $V_b + V_e$, as shown in FIG. 4b. The frequency of the output of oscillator 19 (i.e. 5 MHz) is made to correspond to the average frequency of capacitance variations during actual disc record playback conditions. Variations in edge capacitance of the MOS structure (of the stylus 13 and wafer 11) will therefore vary at the rate of 5 MHz. The capacitance variations of the MOS structure vary the resonant frequency (approximately 900 MHz) of the tuned circuit 25 which includes the inductance of a transmission line 27, coupled to ground via a blocking capacitor 29 and the junction capacitance of diode 31. A choke coil 32 presents a short for the 5 MHz signal. Radio frequency energy is injected into the tuned circuit by means of an RF oscillator 33 (having an output frequency of illustratively 915 MHz) which is electromagnetically coupled to the transmission line 27. As the resonant frequency of the tuned circuit varies in accordance with the electrode edge capacitance variations, the response of the tuned circuit to the fixed frequency RF signal from oscillator 33 is modulated and a peak detector circuit electromagnetically coupled to the transmission line, comprising diode 35 and resistor 37 detects the resultant modulated RF signal. This modulated RF signal is applied to a pass-band amplifier 39 (e.g., having a pass-band of 0-10 MHz) which extracts the modulation information signal representative of edge capacitance variations. This modulation signal is then applied to a voltmeter device 41 where the peak-to-peak measured voltage provides an unambiguous indication of stylus playing qualities. Since the resonant frequency of the tuned circuit 25 is subject to change for a variety of reasons (e.g., electrode size, stylus positioning angles, etc.), an automatic frequency control stage 40 effects variations in the bias voltage across diode 31 to thereby vary the junction capacitance of the diode in a manner which opposes the changes in the resonant frequency of tuned circuit 25. Illustratively, in the practice of the present invention it was found that the styli of good playing qualities provide a voltmeter reading of approximately 0.3 volts p-p, while defective styli provide a voltmeter reading of approximately 0.05 volts p-p.

It will be appreciated that the principles of the present invention are equally applicable where a p-type silicon wafer is originally employed. Though the biasing voltages and the charges grown in the oxide layer will correspondingly change in polarity, overall operation of the apparatus is not significantly changed.

What is claimed is:

1. Apparatus for determining playback qualities of a stylus which includes an elongated support element and an electrode formed on a longitudinal surface of said support element; comprising:
   means, including a semiconductor layer, for providing capacitive coupling between said stylus electrode and said capacitive coupling means when said capacitive coupling means abuts one end of said stylus; said capacitive coupling being subject to variations in accordance with variations in potential difference between said semiconductor layer and said stylus electrode within a range of values defined between a maximum and a minimum potential difference;

means for establishing a varying potential difference between said semiconductor layer and said stylus electrode in a manner causing variations in the capacitive coupling between said stylus electrode and said semiconductor layer; and means, electrically coupled to said stylus electrode, for developing an electrical signal in response to said variations in capacitive coupling.

2. Apparatus in accordance with claim 1 wherein said conductive coupling comprises a component contributed by capacitive coupling between the abutting end of said stylus electrode and said capacitive coupling means and wherein said capacitive coupling means further includes:

means for changing said maximum and minimum potential difference thereby effecting a shift in the location of said range of values in a manner causing the enhancement of said component relative to other components comprising said capacitive coupling between said stylus electrode and said capacitive coupling means.

3. Apparatus in accordance with claim 2 wherein said potential difference changing means comprises:

a dielectric layer, overlying said semiconductor layer, and which dielectric layer comprises fixed electrical charges.

4. Apparatus in accordance with claim 1 wherein said capacitive coupling means includes:

an n-type semiconductor layer; and a dielectric layer overlying said semiconductor layer.

5. Apparatus in accordance with claim 4 wherein said semiconductor layer is formed of silicon.

6. Apparatus in accordance with claim 5 wherein said dielectric layer is formed of silicon-oxide.

7. Apparatus in accordance with claim 4 wherein said dielectric layer further comprises positive electrical charges fixed therein.

8. A method for determining playback qualities of a stylus which includes an elongated support element and an electrode formed on a longitudinal surface of said support element; said method comprising the steps of:

abutting one end of said stylus to means, including a semiconductor layer, for providing capacitive coupling between said stylus electrode and said means; said capacitive coupling being subject to variations in accordance with variations in the potential difference between said semiconductor layer and said stylus electrode within a range of values defined between a maximum and a minimum potential difference;

establishing a varying potential difference between said layer and said electrode in a manner causing variations in the capacitive coupling between said electrode and said means; and detecting, by electrical means coupled to said stylus electrode, said variations in capacitive coupling.

9. The method in accordance with claim 8 wherein said capacitive coupling comprises a component contributed by capacitive coupling between the bottom of the stylus electrode, near the abutting end of said stylus, and said means; wherein said method further comprises the step of:

effecting a shift in the location of said range of values in a manner causing the enhancement of said component relative to other components comprising said capacitive coupling between said stylus electrode and said layer.

* * * * *